(12) United States Patent
Shah et al.

(10) Patent No.: US 11,612,062 B2
(45) Date of Patent: Mar. 21, 2023

(54) BARRIER LAYER

(71) Applicants: Kunal Shah, Bothell, WA (US); Purvi Shah, Bothell, WA (US)

(72) Inventors: Kunal Shah, Bothell, WA (US); Purvi Shah, Bothell, WA (US)

( * ) Notice: Subject to any disclaimer, the term of this patent is extended or adjusted under 35 U.S.C. 154(b) by 0 days.

(21) Appl. No.: 17/336,113

(22) Filed: Jun. 1, 2021

(65) Prior Publication Data
US 2022/0022325 A1 Jan. 20, 2022

Related U.S. Application Data

(63) Continuation of application No. 16/618,577, filed as application No. PCT/US2018/021891 on Mar. 10, 2018, now Pat. No. 11,058,011.

(60) Provisional application No. 62/549,424, filed on Aug. 24, 2017, provisional application No. 62/469,980, filed on Mar. 10, 2017.

(51) Int. Cl.
H05K 1/09 (2006.01)
H05K 3/28 (2006.01)
H05K 1/11 (2006.01)
H05K 3/24 (2006.01)

(52) U.S. Cl.
CPC ............. *H05K 3/285* (2013.01); *H05K 1/09* (2013.01); *H05K 1/111* (2013.01); *H05K 3/24* (2013.01); *H05K 2201/0218* (2013.01); *H05K 2201/0224* (2013.01); *H05K 2201/0335* (2013.01)

(58) Field of Classification Search
CPC .......... H05K 1/09; H05K 1/092; H05K 1/095; H05K 1/097
See application file for complete search history.

(56) References Cited

U.S. PATENT DOCUMENTS

| 11,058,011 | B2 | 7/2021 | Shah et al. | |
| 2002/0018844 | A1 | 2/2002 | Kitajima et al. | |
| 2002/0149919 | A1* | 10/2002 | Pu | H01L 23/3128 257/E25.011 |
| 2007/0275503 | A1* | 11/2007 | Lin | H01L 24/85 438/106 |

FOREIGN PATENT DOCUMENTS

WO  WO 9739610 A1 * 10/1997 ............... H05K 3/24

OTHER PUBLICATIONS

U.S. Appl. No. 16/618,577, Non-Final Office Action, dated Mar. 18, 2021, 7 pages.
U.S. Appl. No. 16/618,577, Notice of Allowance, dated May 27, 2021, 7 pages.

* cited by examiner

*Primary Examiner* — Jeremy C Norris
(74) *Attorney, Agent, or Firm* — Kilpatrick Townsend & Stockton LLP

(57) ABSTRACT

A barrier layer is disposed on a copper surface, the barrier layer including an organic molecule. The organic molecule may be a nitrogen-containing molecule. The nitrogen-containing organic molecule includes 1 to 6 carbon atoms. The barrier layer may be deposited on an exposed copper surface before deposition of a surface finish.

18 Claims, 2 Drawing Sheets

BARRIER LAYER

CROSS-REFERENCES TO RELATED APPLICATIONS

This application is a continuation of U.S. Non Provisional patent application Ser. No. 16/618,577, filed on Dec. 2, 2019, which is a U.S. National Phase of PCT International Patent Application No. PCT/US2018/021891, filed on Mar. 10, 2018, which claims benefit and priority to U.S. Provisional Patent Application No. 62/549,424, filed on Aug. 24, 2017, and also claims benefit and priority to U.S. Provisional Patent Application No. 62/469,980, filed on Mar. 10, 2017. The disclosures of each aforementioned application are incorporated by reference herein in their entirety.

BACKGROUND OF THE INVENTION

A surface finish on copper pads is used to increase the reliability of PCB-to-surface mount component connectivity at a solder joint, which is critical to an electronic product device's optimum operation over time. Conventional surface finishes can be divided into two main categories: surface finishes with tin-copper (Sn—Cu) based solder joints and surface finishes with tin-nickel (Sn—Ni) based solder joints. There are several surface finishes which fall under the category of Sn—Cu based solder joints, for example, immersion silver (Ag), immersion tin (Sn), Hot Air Solder Leveling (HASL) and organic solderability preservative (OSP). An important benefit of these surface finishes is to protect and shield the Cu surface underneath from oxidation to maintain the solderability. These layers (e.g., immersion Ag, immersion Sn, OSP) get dissolved into molten solder during soldering process such that intermetallics are formed between the solder and the Cu surface. Yet, conventional solder joints are prone to brittle failures leading to malfunction of the electronic assembly

BRIEF SUMMARY

According to an embodiment, a barrier layer that may make solder joints more robust is disclosed. The barrier layer may be deposited on an exposed copper surface before deposition of a surface finish. In one embodiment, the barrier layer is deposited on a copper conductor, and an additional surface finish is not deposited over the barrier layer prior to the soldering process. The disclosed barrier layer may reduce brittle solder failures in the electronic assemblies and improve reliability of electronic devices.

The chemistry of the barrier layer may lead to a favorable intermetallic compound and structure between solder and copper to make sure the solder joint exhibit desired ductile behavior that is less prone to brittle failures.

In one embodiment, the disclosed barrier layer chemistry acts as a barrier layer to copper atoms diffusing into solder material during a surface mount solder reflow (soldering) process, leading to the favorable intermetallic layers which are compact (thin) and distinct (not diffused) between solder and copper. Thin and distinct intermetallic layers can help provide a solder joint that shows desired ductile behavior and may be less prone to brittle failures.

According to an embodiment, the disclosure includes Sn—Cu based solder joints. A barrier layer may be deposited on surface mount copper pads. A surface finish suitable for Sn—Cu based solder joints (e.g., immersion Ag, immersion Sn, OSP, HASL, etc.) may be deposited on the barrier layer. During a solder reflow process (soldering), the surface finish and part of the barrier layer are dissolved into molten solder. The intermetallics formed may be robust which leads to the reduction of brittle solder joints failures and, consequently, more reliable electronic assemblies.

DETAILED DESCRIPTION

Figure 1:
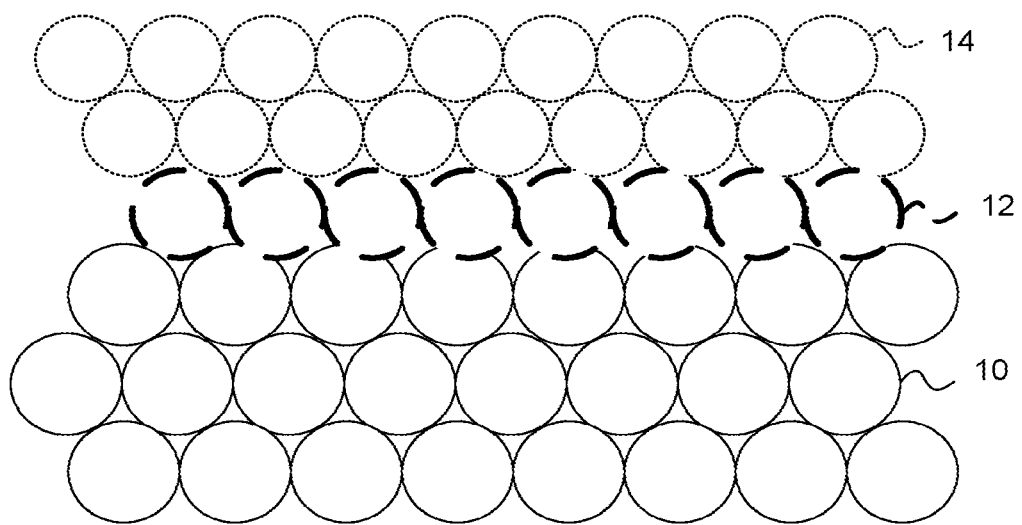
FIG. 1 illustrates an example of various layers including a copper pad, a barrier layer, and a surface finish, according to an embodiment.

In the following detailed description, reference is made to the accompanying drawings, which form a part hereof. In the drawings, similar symbols typically identify similar components, unless context dictates otherwise. Other embodiments may be used and/or other changes may be made without departing from the spirit or scope of the disclosure. FIG. 1 illustrates various printed circuit board (PCB) layers comprising a conductive pad with surface finish, according to an embodiment. The layers generally include a copper layer 10 and a barrier layer 12, according to embodiments. The barrier layer 12 may optionally form the entirety or substantially the entirety of the surface finish. Alternatively, the barrier layer 12 may be disposed between a subjacent copper layer 10 and a superjacent layer 14, wherein the barrier layer 12 and the superjacent layer 14 collectively comprise the surface finish. The view of FIG. 1 is an idealized side sectional view of layers in an assembled state before exposure to a solder reflow process (typically used to affix and make electrical connection to a surface mount component), wherein each circle represents an atom of a respective material.

The copper layer 10, of which only a top three layers of atoms are shown in FIG. 1 (Surface Finish Stack on Copper Substrate), can be conventional, and may typically be several hundred micrometers thick. In one embodiment, the copper layer 10 is at least several tens of micrometers thick. The barrier layer 12 is typically quite thin. In one embodiment, the barrier layer 12 is less than 100 nanometers thick. In some embodiments, the barrier layer 12 is less than 10 nanometers thick. In some embodiments, the barrier layer 12 may be a monolayer or may amount substantially to a monolayer (as shown in the idealized depiction of FIG. 1). In some embodiments, the barrier layer 12 may enter or substantially enter into the top portion of the copper through diffusion or capillary action, particularly if the copper is sintered or microporous.

A surface finish component, superjacent layer 14 may include electroplated gold (Au), electroless gold (Au), immersion gold (Au), electroplated silver (Ag), electroless silver (Ag), immersion silver (Ag), immersion tin (Sn), organic solderability preservative (OSP), Hot Air Solder Levelling (HASL), etc. According to an embodiment, the superjacent layer 14 may include gold. For example, the superjacent layer 14 may be provided by electroplating, electroless plating, or immersion coating onto the copper layer 10 and barrier layer 12 assemblage.

According to an embodiment, the superjacent layer 14 may include silver. For example, the superjacent layer 14 may be provided by electroplating, electroless plating, or immersion coating onto the copper layer 10 and barrier layer 12 assemblage.

The instant disclosure involves interfacial engineering and inclusion of the barrier layer 12 on the surface of copper layer 10. A surface finish component, superjacent layer 14 may include gold (electroless, electroplated, immersion), silver (electroplated, electroless, immersion), immersion tin (Sn), organic solderability preservative (OSP), Hot Air Solder Levelling (HASL), etc. that is deposited on top of the barrier layer 12. Inclusion of the barrier layer 12 on a copper layer 10 surface may lead to robust solder joints following a solder reflow process (soldering). Barrier chemistry of barrier layer 12 can include at least one nitrogen-containing organic molecule. In some embodiments, the nitrogen-containing organic molecule is an aliphatic amine. In embodiments, the nitrogen-containing organic molecule can be a noncyclic aliphatic amine.

Embodiments related to making the barrier layer may include providing a water solution carrying a nitrogen-containing organic molecule. Making the water solution of the nitrogen-containing organic molecule may include making a solution, in deionized water, of a nitrogen-containing organic molecule. Making a water solution of a nitrogen-containing organic molecule may include making a solution of 0.1 to 1 molar 1,4 diamine butane or making a solution of 0.1 to 1 molar diethylene triamine. Making a water solution of a nitrogencontaining organic molecule may include making a water solution of a non-cyclic aliphatic amine. Making the water solution of the nitrogencontaining organic molecule may include adjusting the pH to about 12. Ammonium hydroxide may be used to adjust the pH.

For embodiments where a less-soluble nitrogen-containing organic molecule is used, making the water solution may include adding an emulsifier and/or a detergent to the water. The nitrogen-containing organic molecule(s) may include one or more of R1-NH2, NH2-R1-NH2, NH2-R1-NH2NH2, NH2-R1-NH2-R2-NH2, R1-N—R2H, and R1-N—R2R3; R1 is a first substituted or unsubstituted aliphatic group of C18 or less; where R2 is a second substituted or unsubstituted aliphatic group of C18 or less where R3 is a third substituted or unsubstituted aliphatic group of C18 or less.

In an embodiment, the nitrogen-containing organic molecule includes 1 to 6 carbon atoms. In another embodiment, the nitrogen-containing molecule includes 3 to 5 carbon atoms. In an embodiment, the nitrogen-containing molecule includes 1,4 diamine butane. In an embodiment, the nitrogen-containing molecule includes diethylene triamine. $R^1$, $R^2$, and $R^3$ can be, independently at each occurrence, a methyl group, a linear alkane, a branched alkane, an unsaturated aliphatic group, and not a cyclic saturated or unsaturated aliphatic group. In an embodiment, the carbon-based barrier layer includes or consists essentially of 1,4 diamine butane.

A barrier layer is applied to the copper, the barrier layer including at least a portion of a nitrogen-containing organic molecule. In an embodiment, applying the barrier layer to the copper layer 10 may include maintaining the temperature of the water solution at 30-80° C. while exposing the water solution of the nitrogen-containing organic molecule to the copper layer 10 for 5-40 minutes.

In an alternative embodiment, applying the barrier layer 12 to the copper layer 10 can include dissolving the nitrogen-containing organic molecule in a vapor and condensing the nitrogen-containing molecule out of the vapor onto the copper layer 10. For example, a molecule such as 1,4 diamine butane may be carried by a butane vapor and may be condensed onto the copper layer 10 therefrom.

According to another embodiment, the barrier layer 12 is deposited onto the copper layer 10 from a high molecular weight matrix by adhesion of a solid or viscous liquid layer such as a polyester-supported polymethyl methacrylate host polymer carrying a nitrogen-containing molecule guest, followed by peeling away of the polyester, optionally, aided by application of heat.

In an alternative embodiment, applying the barrier layer 12 to the copper layer 10 may include embedding the nitrogen-containing organic molecule in a polymer matrix supported by a transfer film, placing polymer matrix side of the transfer film in close proximity to the copper layer 10 surface, and applying heat to the transfer film to cause the nitrogen-containing organic molecule to diffuse out of the polymer matrix and condense on the copper layer 10.

In one embodiment, surface finish component is not deposited on barrier layer 12. Instead, solder in a solder process is applied directly to barrier layer 12. In this embodiment, the barrier layer 12 is suitable to properly passivate copper layer 10 to reduce oxidation or corrosion.

The barrier layer 12 is deposited on the surface of copper layer 10, in the illustrated embodiment, typically from a water-based solution. In an experiment, a water-based solution prepared by dissolving or suspending diamine butane in water to form a 0.5 molar solution. The pH was adjusted to 12 by adding ammonium hydroxide. Similar solutions or suspensions of functionalized carbon chains of 3 atoms or higher may provide similar activity. Functionalized carbon chains of 8 atoms or fewer may also provide similar activity. Longer length carbon chain water solutions may be enabled by addition of detergent or other functionalized lipids.

Carbon functional groups from barrier layer 12 attach (chemisorb) to copper atoms on the surface of copper layer 10 as well as diffusing through intergranular boundaries in the copper layer 10. The chemisorption passivates the surface of copper layer 10, decreases migration of oxygen into the copper layer 10, and reduces the risk of oxidation of the copper layer 10. The reduction in copper oxidation further reduces subsequent risk of degradation of solderability.

Figure 2:
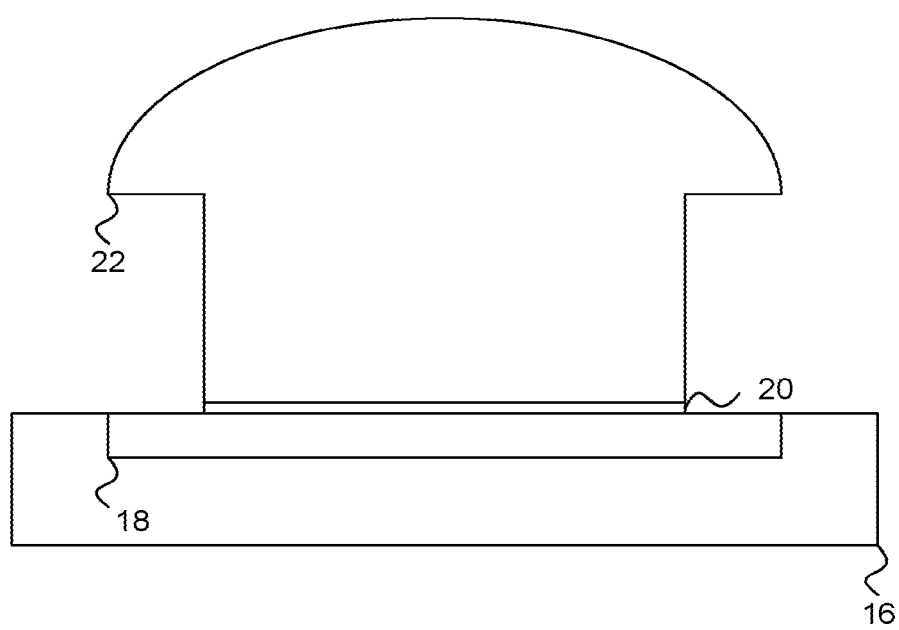
FIG. 2 illustrates an example of an assembly that includes solder, a solder joint, a copper pad, and a printed circuit board (PCB), according to an embodiment.

Chemisorption of barrier layer 12 on copper layer 10 or diffusion of barrier layer 12 chemistry through the intergranular boundaries will eventually result in achieving robust solder joints 20 including intermetallics, as illustrated in FIG. 2 (Solder Joints Assembly). Solder joints 20 may be intermetallics. As a result, brittle solder failures and component fall-offs in the electronic assemblies may be reduced, thereby increasing the reliability of electronic devices. FIG. 2 illustrates an example of an assembly that includes a solder 22, solder joints 20 between the solder and barrier layer 12 containing copper pad 18 disposed on the surface and forming a portion of a PCB 16, according to an embodiment.

In embodiments, a solder process is applied directly to the barrier layer 12. Preferably, the barrier layer 12 is suitable to properly passivate copper layer 10 to reduce oxidation/corrosion prior to placement of solder paste and reflow.

Referring to FIG. 1 in comparison to FIG. 2, during a solder reflow process, the barrier layer 12 and the entire surface finish and, optionally, 14 is dissolved into the solder 22. Solder joints 20 are formed between the copper layer 10, the superjacent layer 14 (if present), and the solder 22. Intermetallic layer thickness depends on several variables including solder alloy composition, number of reflow cycles, reflow temperature and time, temperature cycling exposure, etc. Analyses indicate that intermetallic layers or on the order of few microns, but the thickness is quite variable and a function of the type of solder joints.

The presence of the barrier layer 12 may help to keep the solder joints 20 (intermetallics) thin and well-defined, which has been found to improve solder joint strength. The chemistry and structure of the intermetallics, including solder (tin alloy), copper layer 10 and the barrier layer 12 chemistry is more robust and shows desired ductile behavior compared to a solder joint formed from components that do not include the barrier layer 12. The ductility reduces the incidence brittle failures, including failures responsive to shock and vibration.

In one aspect, embodiments include a cost-effective barrier layer 12 which is deposited on copper layer 10 to achieve robust Sn—Cu based solder joints 20. In one embodiment, surface finish with Sn—Cu based solder joints (e.g., immersion Ag, immersion Sn, OSP, etc.) is deposited on top of barrier layer 12 which get dissolved during solder reflow (soldering process).

One embodiment of the disclosure includes a cost-effective barrier layer 12 on a surface of copper layer 10 to achieve robust Sn—Cu based solder joints for better reliability of electronic assemblies. One embodiment includes barrier layer 12 on the surface of copper layer 10 before the deposition of surface finish (Sn—Cu solder joints based surface finish, e.g., immersion Ag, immersion Sn, OSP, etc.) to eliminate corrosion/oxidation of the copper layer 10 surface. The presence of barrier layer 12 passivates the copper layer 10 surface and minimizes the risk of reducing solderability. Following the solder reflow process, the surface finish and partial barrier layer 12 get dissolved in molten solder. The disclosed barrier layer 12 on a copper layer 10 surface is a cost-effective way to reduce oxidation/corrosion of a copper layer 10 surface and generate robust solder joints at potentially less expensive costs.

In another embodiment, the barrier layer is applied to copper or copper/nickel surface to form chelating chemistry on a metal surface, for example, a tank for jet fuel. The barrier layer molecules may penetrate through a top layer of copper or copper/nickel surface through intergranular boundaries leaving a few nm of the top layers completely passivated. Due to the size of the amine molecules (butane, octane, etc. aliphatic groups), the passivation layer may penetrate through the intergranular boundaries or crevices up to few hundred nm and may form part of copper grains instead of being a separate layer. This may be effective in eliminating dissolution of Cu atoms into jet fuel and improving the stability of the fuel.

The organic molecule(s) may include one or more of: $R_1$—H3, OHC—$R_1$—CHO, HOOC—$R_1$—COOH, $R_1$—O—$R_2$, $R_1$—CO—$R_2$; where $R_1$ is a first substituted or unsubstituted aliphatic group of C18 or less; where $R_2$ is a second substituted or unsubstituted aliphatic group of C18 or less; where R3 is a third substituted or unsubstituted aliphatic group of C18 or less.

In an embodiment, the organic molecule includes 1 to 6 carbon atoms. In another embodiment, the organic molecule includes 3 to 5 carbon atoms. R1, R2, and R3 can be, independently at each occurrence, a methyl group, a linear alkane, a branched alkane, an unsaturated aliphatic group, and not a cyclic saturated or unsaturated aliphatic group. In an embodiment, the carbon-based barrier layer includes or consists essentially of butane.

While various aspects and embodiments have been disclosed herein, other aspects and embodiments are contemplated. The various aspects and embodiments disclosed herein are for purposes of illustration and are not intended to be limiting, with the true scope and spirit being indicated by the following claims.

What is claimed is:
1. A printed circuit board (PCB), comprising:
   a plurality of copper pads; and
   a barrier layer disposed on the copper pads, wherein the barrier layer comprises substantially a monolayer that includes one or more nitrogen-containing organic molecules, and wherein the barrier layer comprises 1,4 diamine butane.
2. The PCB of claim 1 wherein the barrier layer comprises diethylene triamine.
3. The PCB of claim 1 wherein each of the plurality of copper pads includes a plurality of copper grains separated by grain boundaries, and wherein the barrier layer is disposed within at least a portion of the grain boundaries.
4. A printed circuit board (PCB) comprising:
   a copper layer including:
   a top portion having a plurality of copper grains each separated by passivated grain boundaries, wherein each of the passivated grain boundaries comprises one or more nitrogen-containing organic molecules; and
   a bottom portion having a plurality of copper grains each separated by non-passivated grain boundaries.
5. The PCB of claim 4 wherein each of the passivated grain boundaries comprises 1,4 diamine butane.
6. The PCB of claim 4 wherein each of the passivated grain boundaries comprises diethylene triamine.
7. The PCB of claim 4 wherein each of the passivated grain boundaries comprises one or more of R1-H3, OHC—R1-CHO, HOOC—R1-COOH and R1-O—R2, R1-CO—R2,
   where R1 is a first substituted or unsubstituted aliphatic group of C18 or less;
   where R2 is a second substituted or unsubstituted aliphatic group of C18 or less; and
   where R3 is a third substituted or unsubstituted aliphatic group of C18 or less.
8. The PCB of claim 7 wherein R1, R2, and R3 are unsubstituted alkane groups.
9. The PCB of claim 7, wherein R1, R2, and R3 are substituted or unsubstituted aliphatic groups having one to six carbon atoms.
10. The PCB of claim 7, wherein R1, R2, and R3 are substituted or unsubstituted aliphatic groups having three to five carbon atoms.
11. The PCB of claim 7, wherein R1, R2, and R3 are each, independently, a methyl group, a linear alkane, a branched alkane, or an unsaturated aliphatic group, and wherein R1, R2, and R3 are not cyclic groups.
12. The PCB of claim 4 wherein each of the passivated grain boundaries comprises a nitrogen containing organic molecule(s) including one or more of:
   R1-NH2, NH2-R1-NH2, NH2-R1-NH2NH2, NH2-R1-NH2-R2-NH2, R1-N—R2H, and R1-N—R2R3;
   wherein R1 is a first substituted or unsubstituted aliphatic group of C18 or less;
   wherein R2 is a second substituted or unsubstituted aliphatic group of C18 or less; and
   wherein R3 is a third substituted or unsubstituted aliphatic group of C18 or less.
13. A printed circuit board (PCB) comprising:
   a copper layer including a top portion positioned above a bottom portion, wherein the top portion includes a plurality of passivated grain boundaries that each include one or more nitrogen-containing organic molecules, and wherein the bottom portion includes a plurality of non-passivated grain boundaries.
14. The PCB of claim 13 wherein each of the plurality of passivated grain boundaries comprises 1,4 diamine butane.
15. The PCB of claim 13 wherein each of the plurality of passivated grain boundaries comprises diethylene triamine.

16. The PCB of claim 13 wherein each of the plurality of passivated grain boundaries comprises one or more of R1-H3, OHC—R1-CHO, HOOC—R1-COOH and R1-O—R2, R1-CO—R2,
- where R1 is a first substituted or unsubstituted aliphatic group of C18 or less;
- where R2 is a second substituted or unsubstituted aliphatic group of C18 or less; and
- where R3 is a third substituted or unsubstituted aliphatic group of C18 or less.

17. The PCB of claim 13 wherein each of the plurality of passivated grain boundaries comprises a nitrogen containing organic molecule(s) including one or more of:
- R1-NH2, NH2-R1-NH2, NH2-R1-NH2NH2, NH2-R1-NH2-R2-NH2, R1-N—R2H, and R1-N—R2R3;
- wherein R1 is a first substituted or unsubstituted aliphatic group of C18 or less;
- wherein R2 is a second substituted or unsubstituted aliphatic group of C18 or less; and
- wherein R3 is a third substituted or unsubstituted aliphatic group of C18 or less.

18. The PCB of claim 13 wherein R1, R2, and R3 are unsubstituted alkane groups.

* * * * *